(12) United States Patent  
Park et al.

(10) Patent No.: US 7,521,331 B2
(45) Date of Patent: Apr. 21, 2009

(54) HIGH DIELECTRIC FILM AND RELATED METHOD OF MANUFACTURE

(75) Inventors: Hong-bae Park, Seoul (KR); Yu-gyun Shin, Seongnam-si (KR); Sang-bom Kang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 276 days.

(21) Appl. No.: 11/359,404

(22) Filed: Feb. 23, 2006

(65) Prior Publication Data

US 2006/0205186 A1    Sep. 14, 2006

(30) Foreign Application Priority Data

Mar. 10, 2005    (KR) ...................... 10-2005-0020134

(51) Int. Cl.
*H01L 21/76* (2006.01)
(52) U.S. Cl. ................. 438/400; 438/761; 257/E21.547
(58) Field of Classification Search ................. 438/400, 438/761
See application file for complete search history.

(56) References Cited

U.S. PATENT DOCUMENTS

2004/0198069 A1    10/2004    Metzner et al.

FOREIGN PATENT DOCUMENTS

| KR | 1020010111448 | 12/2001 |
| KR | 1020020009862 | 2/2002 |
| KR | 10-0356473-0000 | 9/2002 |
| KR | 1020030047337 | 6/2003 |

*Primary Examiner*—W. David Coleman
(74) *Attorney, Agent, or Firm*—Volentine & Whitt, PLLC (57) ABSTRACT

A method of forming a high dielectric film for a semiconductor device comprises supplying a first source gas to a reaction chamber during a first time interval, supplying a first reactant gas to the reaction chamber during a second time interval after the first time interval, supplying a second source gas to the reaction chamber for a third time interval after the second time interval, supplying a second reactant gas to the reaction chamber for a fourth time interval after the third time interval, and supplying an additive gas including nitrogen to the reaction chamber during a fifth time interval.

31 Claims, 6 Drawing Sheets

HIGH DIELECTRIC FILM AND RELATED METHOD OF MANUFACTURE

BACKGROUND OF THE INVENTION

1. Field of the Invention

Embodiments of the present invention relate generally to a dielectric film for a semiconductor device. More particularly, embodiments of the invention relate to a high dielectric film formed by Atomic Layer Deposition (ALD), and related methods of manufacture.

A claim of priority is made to Korean Patent Application No. 10-2005-0020134, filed on Mar. 10, 2005, the disclosure of which is hereby incorporated reference in its entirety.

2. Description of Related Art

Semiconductor device manufacturers are continually striving to increase the integration density and capacity of semiconductor devices such as computer memories and other electronic data processing elements. As the integration density and capacity of the devices increases, materials with a higher dielectric constant must be used to form gate dielectric films and capacitor dielectric films in the devices. Such films formed with materials having a high dielectric constant are often referred to as "high dielectric films."

One benefit of using high dielectric films in semiconductor devices is that they prevent leakage current that can be caused by electron tunneling. For example, where a high dielectric film is used as a dielectric for a capacitor, leakage current is prevented from passing between the capacitor's upper and lower electrodes. In general, physical thickness "t" of a high dielectric film is generally larger than the oxide equivalent thickness (Toxeq) of the high dielectric film. In other words, the high dielectric film must be thicker than a silicon dioxide ($SiO_2$) layer with the same capacitance as the high dielectric film. For example, a $SiO_2$ layer thinner than 20 μm generally allows significant leakage current due to electron tunneling; however a high dielectric film comprising $HfO_2$, $ZrO_2$, $Ta_2O_5$, or $TiO_2$ and having the same oxide equivalent thickness (Toxeq) will have less leakage current.

Unfortunately, conventional high dielectric films used as gate insulating layers in metal-oxide semiconductor field-effect transistor (MOSFET) devices suffer from a number of shortcomings. For example, where a high dielectric film such as HfO2 or ZrO2 is used for a gate insulating layer of a MOSFET, carrier mobility in the MOSFET's channel region can be degraded by dispersion of dopants such as boron (B), phosphorus (P), and arsenic (As) from a polysilicon gate electrode above the gate insulating layer through the high dielectric film. Further, a high dielectric film comprising HfO2 can be crystallized by subsequent annealing, creating a crystallized interface with a significant amount of leakage current.

To address at least the above problems, researchers have sought ways to prevent dopant dispersion and enhance thermal stability in high dielectric films comprising an oxide layer such as HfO2. One approach that the researchers have taken is to add Al2O3 or nitrogen to the oxide to form a nitride layer or an aluminum oxide layer such as HfON or HfAlO. Although this approach is an improvement over the HfO2 layer, it is still not adequate for a transistor in a highly miniaturized device.

On the other hand, a Si-containing Hf-silicate material such as HfSiO, can be used as an alternative to HfO2. A HfSiO layer formed over a channel region of a silicon substrate generally has improved leakage current over HfO2, and it allows better charge mobility in the channel region. However, the HfSiO layer still allows the charge mobility of the channel region to be degraded by dopant dispersion from the polysilicon gate electrode above the gate insulating layer.

To further prevent the dopant dispersion and secure the thermal stability of the high dielectric film, nitrogen is often added to the high dielectric film. For example, nitrogen may be added to a high dielectric film comprising HfO2 or HfSiO to form a nitride oxide layer with a high dielectric constant. The nitride oxide layer blocks the dispersion of impurities from the polysilicon gate electrode to the channel region and improves thermal stability by raising the crystallizing temperature of the high dielectric film. When forming a nitride oxide layer such as HfON or HfSiON, nitridation may be performed by annealing an oxide layer in an environment containing NH3 . One problem with using the annealing technique to form the nitride oxide layer is that it does not allow precise control over the profile of nitrogen within the nitride oxide layer. In addition, the annealing technique must be performed as a separate process in addition to the other processes used to form the high dielectric film, thereby increasing the complexity of the methods used to form the high dielectric film.

To address the shortcomings of the conventional nitride oxide layers, new manufacturing methods have been developed, whereby a HfSiON layer is formed by ALD using an N-containing Hf precursor and a Si precursor. One of the problems with the new methods is that N-bonds may not readily form in the HfSiON layer within a thin high dielectric film. On the other hand, where N is included in a Hf precursor such as Hf[N(CH3)2]4, a N—C bond within the precursor may be so strong that carbon remains in a HfSiO layer formed by oxidizing the Hf precursor with an oxidant such as H2O. The carbon remaining in the HfSiO layer tends to degrade the electrical characteristics of the layer.

Finally, as the integration density and capacity of a semiconductor device increases, the area for each capacitor within the device decrease. Since the capacitance required for stable operation of a capacitor cannot be decreased, the dielectric constant of a dielectric film within the capacitor must be increased to provide the required capacitance. One conventional technique for increasing the dielectric constant of a dielectric film is to replace a SiO2 layer, which has a dielectric constant of about 3.9, or a Si3N4 layer, which has a dielectric constant of ~7.2, or a composite silicon nitride/silicon oxide layer (e.g., an oxide-nitride-oxide layer), which typically has a dielectric constant of 3.9~7.2, with a high dielectric film. However, as described above, conventional high dielectric films have numerous shortcomings.

SUMMARY OF THE INVENTION

Embodiments of the present invention provide several methods of forming a high dielectric film by atomic layer deposition. Several of these embodiments address the need to improve leakage current characteristics by reducing defects such as carbon within the high dielectric film and precisely controlling the quantity of nitrogen within the high dielectric film. In addition, embodiments of the present invention also provide semiconductor devices including a high dielectric film formed by atomic layer deposition.

According to one embodiment of the invention, a method of fabricating a semiconductor device having the high dielectric film comprises supplying a first source gas to a reaction chamber during a first time interval, supplying a first reactant gas to the reaction chamber during a second time interval after the first time interval, supplying a second source gas to the reaction chamber for a third time interval after the second time interval, supplying a second reactant gas to the reaction chamber for a fourth time interval after the third time interval, and supplying an additive gas including nitrogen to the reaction chamber during a fifth time interval. Preferably, the first source gas comprises Hf[N($C_2H_5$)$CH_3$]$_4$, the second source gas comprises $H_2N(CH_2)_3Si(OC_2H_5)_3$, the reactant gas comprises $O_3$, and the additive gas comprises $NH_3$.

According to another embodiment of the present invention, a method of fabricating a semiconductor device comprises forming a high dielectric film on a semiconductor substrate located in a reaction chamber, wherein forming the dielectric film comprises supplying a first source gas to the reaction chamber during a first time interval, supplying a first reactant gas to the reaction chamber during a second time interval after the first time interval, supplying a second source gas to the reaction chamber for a third time interval after the second time interval, supplying a second reactant gas to the reaction chamber for a fourth time interval after the third time interval, and supplying an additive gas including nitrogen to the reaction chamber during a fifth time interval. The method further comprises forming a gate electrode material on the high dielectric film and etching the gate electrode material and the high dielectric film to form a gate structure.

According to yet another embodiment of the invention, a method of fabricating a semiconductor device comprises forming a lower electrode on a semiconductor substrate and forming a high dielectric film on the lower electrode, wherein forming the high dielectric film comprises supplying a first source gas to a reaction chamber during a first time interval, supplying a first reactant gas to the reaction chamber during a second time interval after the first time interval, supplying a second source gas to the reaction chamber for a third time interval after the second time interval, supplying a second reactant gas to the reaction chamber for a fourth time interval after the third time interval, and supplying an additive gas including nitrogen to the reaction chamber during a fifth time interval. The method of fabricating the semiconductor device further comprises forming an upper electrode on the high dielectric film.

Embodiments of the invention further provide various semiconductor devices and high dielectric layers formed according to the above described methods.

BRIEF DESCRIPTION OF THE DRAWINGS

The invention is described below in relation to several embodiments illustrated in the accompanying drawings. Throughout the drawings, like reference numbers indicate like exemplary elements, components, or steps. In addition, the thickness of layers in the drawings is exaggerated for clarity. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Figure 1:
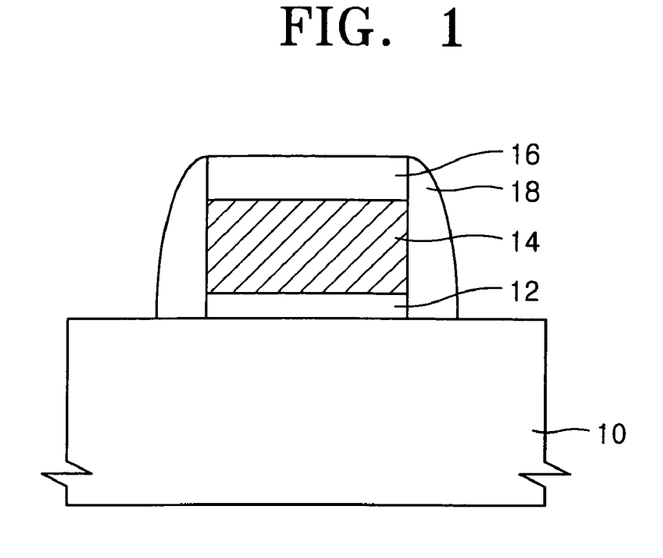
FIG. 1 is a sectional view of a gate structure including a HfSiON layer acting as a gate insulating layer and formed according to an embodiment of the present invention.

FIG. 1 is a sectional view of a semiconductor device including a gate structure fabricated according to an embodiment of the present invention. Referring to FIG. 1, a gate dielectric film layer, a gate electrode material layer, a gate mask layer, and a mask pattern are successively formed on a semiconductor substrate 10. Then, the gate mask layer, the gate electrode material layer, and the dielectric film layer are etched using the mask pattern as an etch mask to form a gate structure including a gate dielectric film 12, a gate electrode material 14, and a gate mask 16, sequentially stacked on semiconductor substrate 10. After the gate structure is formed, a gate spacer 18 comprising a material such as silicon nitride or silicon oxide is formed along sidewalls of the gate structure for insulation from subsequently formed layers.

Semiconductor substrate 10 preferably comprises a single-crystal silicon substrate, and gate dielectric film 12 preferably comprises a hafnium silicon oxynitride (HfSiON) high dielectric film formed by atomic layer deposition (ALD). Gate electrode material 14 preferably comprises polysilicon doped with a dopant such as boron (B), phosphorus (P), or arsenic (As), and gate mask 16 preferably comprises silicon nitride.

A metal-oxide semiconductor (MOS) transistor is formed by doping semiconductor substrate 10 to form source/drain regions adjacent to the gate structure. The source/drain regions define a channel region in semiconductor transistor substrate below the gate structure.

Figure 2:
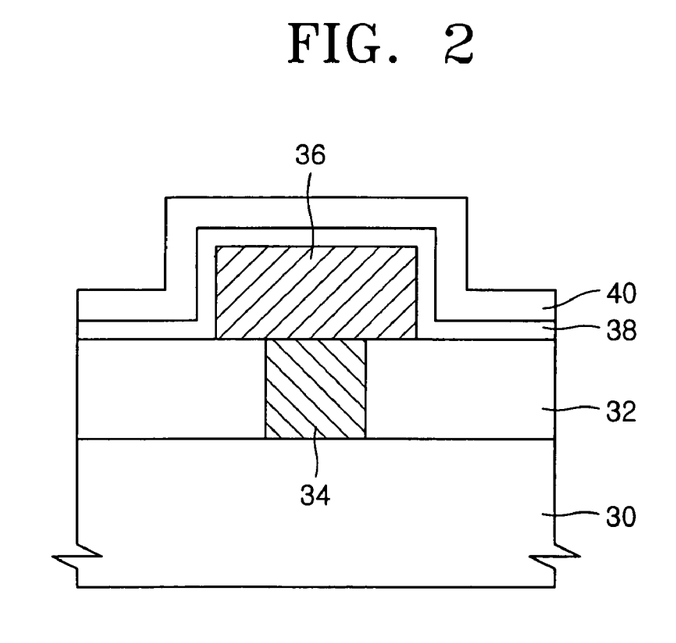
FIG. 2 is a sectional view of a capacitor structure including a HfSiON layer acting as a capacitor dielectric film and formed according to another embodiment of the present invention.

FIG. 2 is a sectional view of a semiconductor device including a capacitor structure fabricated according to one embodiment of the present invention. Referring to FIG. 2, an insulating interlayer 32 is formed on a semiconductor substrate 30. Insulating interlayer preferably comprises an insulating material including a nitride-group or an oxide-group and semiconductor substrate 30 preferably comprises a single crystal silicon substrate. A contact hole is formed in insulating interlayer 32 and a conductive layer plug 34 contacting semiconductor substrate 30 is formed in the contact hole. A lower electrode layer is formed on insulating interlayer 32 and the lower electrode layer is patterned to form a lower electrode 36. A capacitor dielectric film 38 is then formed on insulating interlayer 32 over lower electrode 36. Capacitor dielectric 38 preferably comprises a HfSiON high dielectric film formed by ALD. Finally, an upper electrode material 40 comprising a polysilicon layer doped with a dopant such as boron (B), phosphorus (P) or arsenic (As) is formed on capacitor dielectric 38.

Figure 3:
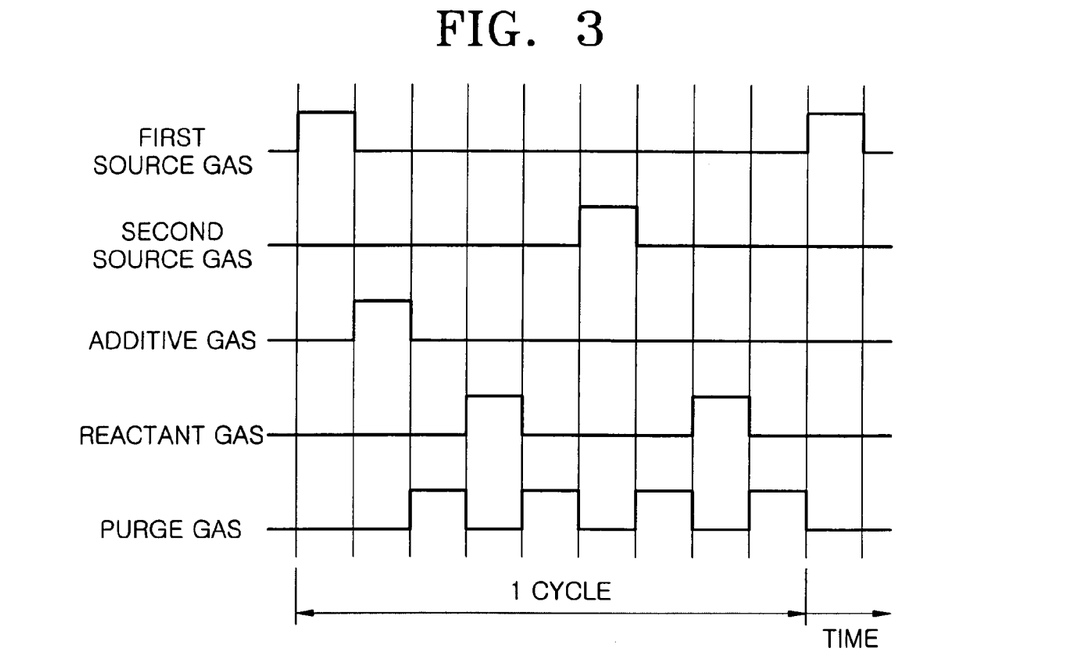
FIGS. 3 through 10 are gas pulsing diagrams illustrating gases supplied to a reaction chamber in an ALD process used to form a high dielectric film according to selected embodiments of the present invention.

FIG. 3 is an exemplary gas pulsing diagram showing gases supplied to a reaction chamber to form the HfSiON high dielectric film for gate dielectric film 12. The same gas pulsing diagram could also apply to a process for forming the HfSiON high dielectric film for capacitor dielectric 38.

Referring to FIG. 3, a semiconductor substrate is loaded into the reaction chamber. Then, a first source gas comprising a hafnium (Hf) precursor is supplied to the reaction chamber for a predetermined time, e.g. 1 second, to form a chemical adsorption layer including Hf. The Hf precursor preferably comprises an Hf compound in which Hf is bonded with oxygen (O), carbon (C), hydrogen (H), chlorine (Cl) or nitrogen. For example, the Hf compound could comprise tetrakis ethyl methyl amino hafnium (Hf[N($C_2H_5$)$CH_3$]$_4$ or TEMAH), tetrakis dimethyl amino hafnium (Hf[N($CH_3$)$_2$]$_4$ or TDMAH), tetrakis diethyl amino hafnium (Hf[N($C_2H_5$)$_2$]$_4$ or TDEAH), Hf[OC($CH_3$)$_3$]$_4$, or hafnium chloride ($HfCl_4$).

Subsequently, an additive gas is supplied to the reaction chamber for a predetermined time, e.g., 1 second. The additive gas preferably comprises ammonia ($NH_3$) gas, $N_2O$ gas, NO gas, or $NH_3$ plasma. The additive gas is used to remove CH radicals and carbon from the Hf precursor to form an intermediary layer comprising HfN.

Next, a purge gas is supplied to the reaction chamber for a predetermined period of time to remove reaction byproducts and unabsorbed Hf therefrom. The purge gas preferably comprises argon (Ar) gas, helium (He) gas, or nitrogen (N) gas.

Next, a first reactant gas is supplied to the reaction chamber for a predetermined time, e.g., 3 seconds, to oxidize the Hf compound chemically adsorbed on semiconductor substrate 10. The reactant gas preferably comprises $O_3$, $H_2O$, $H_2O_2$, $CH_3OH$, $C_2H_5OH$, or $C_3H_7OH$. In one example, $O_3$ is used as the reactant gas to form a HfON layer on semiconductor substrate 10.

Next, the purge gas is again supplied to the reaction chamber for a predetermined time period, e.g., 3 seconds, to eliminate any by-products and unused reactant gas.

Then, a second source gas is supplied to the reaction chamber for a predetermined time period, e.g., 1 second, to form a chemical adsorption layer on the HfON layer. The second source gas preferably comprises a silicon (Si) precursor comprising a Si-based compound where Si is bonded with oxygen, carbon, hydrogen, or nitrogen. For example, second source gas typically comprises $H_2N(CH_2)_3Si(OC_2H_5)_3$ (APTES), SiH[N($CH_3$)$_2$]$_3$, Si[N($CH_3$)$_2$]$_4$, Si[N($CH_3$)$C_2H_5$]$_4$ or HSi[N($C_2H_5$)$_2$]$_3$.

After the second source gas is supplied to the reaction chamber, the purge gas is again supplied to the reaction chamber for a predetermined time, e.g., 1 second, to remove by products and any remaining second source gas from the reaction chamber.

Subsequently, a second reactant gas is again supplied to the reaction chamber for a predetermined time period such as 3 seconds to oxidize the Si compound. After the second reactant gas is supplied to the reaction chamber, the purge gas is again supplied to the reaction chamber for a predetermined time period, e.g., 1 second, to remove by products and any remaining reactant gas from the reaction chamber. The second reactant gas preferably comprises $O_3$, $H_2O$, $H_2O_2$, $CH_3OH$, $C_2H_5OH$, or $C_3H_7OH$. In one example, $O_3$ is used as the second reactant gas.

The processes described in relation to FIG. 3 constitute a single cycle for forming a HfSiON high dielectric layer according to one embodiment of the present invention. The HfSiON high dielectric layer can formed to a desired thickness by repeating the cycle multiple times.

As described above with reference to FIG. 3, $NH_3$ gas is supplied to the reaction chamber after the Hf precursor to decrease the amount of carbon remaining within the HfSiO layer. The HfSiON film is then formed by adding nitrogen gas to the HfSiO film to improve its thermal stability. The supply time, the number of supply times, and the supply amount of $NH_3$ gas can be adjusted to accurately control the amount of nitrogen within the HfSiON layer during processing. Accordingly, the carbon content is decreased to improve the electrical characteristics of the HfSiON film, and the nitrogen content is increased to improve the thermal stability of the HfSiON film.

Figure 11:
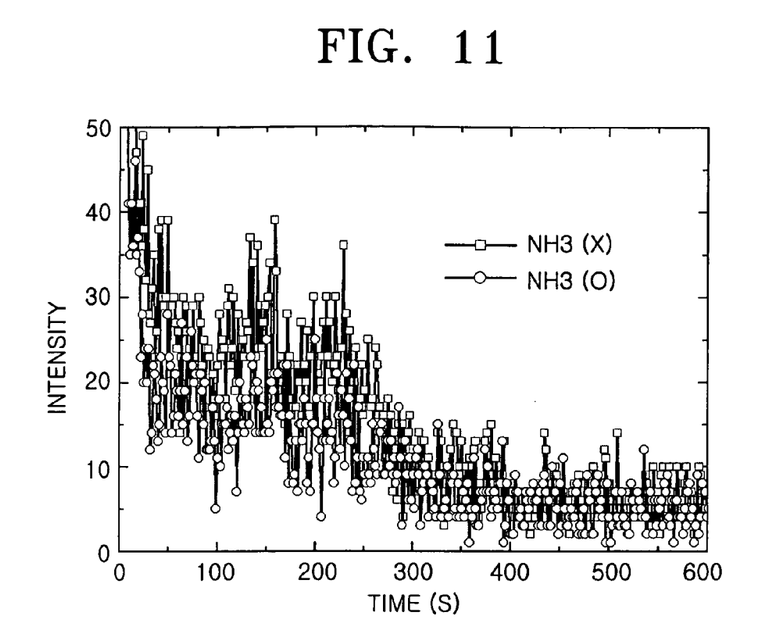
FIG. 11 is a graph illustrating the carbon content of a high dielectric film formed according to an embodiment of the present invention and the carbon content of a high dielectric film formed by a conventional technique; and, FIG. 12 is a graph illustrating a nitrogen distribution within a high dielectric film formed according to an embodiment of the present invention and the nitrogen distribution within a high dielectric film formed by a conventional technique.

FIG. 11 is a graph illustrating a comparison between the carbon content of a HfSiON layer formed according to an embodiment of the present invention and the carbon content of a conventional HfSiO layer. The HfSiO layer and the HfSiON layer of FIG. 11 were both formed by performing several ALD cycles, each including the following steps: supplying TEMAH to the reaction chamber for 1 second as the first source gas, supplying argon gas to the reaction chamber for 1 second as the purge gas, supplying $O_3$ to the reaction chamber for 3 seconds as the reactant gas, supplying argon gas to the reaction chamber for 3 seconds as the purge gas, supplying APTES to the reaction chamber for 1 second as the second source gas, supplying argon gas to the reaction chamber for 1 second as the purge gas, again supplying $O_3$ to the reaction chamber for 3 seconds as the reactant gas, and then again supplying argon gas to the reaction chamber for 3 seconds as the purge gas. However, the HfSiON layer was formed by also supplying the additive gas $NH_3$ while the HfSiO layer was formed without the additive gas. Accordingly, measurements of the HfSiO layer are indicated in FIG. 11 by the legend NH3 (X) to show that the layer was formed without $NH_3$ and the measurements of the HfSiON layer are indicated by the legend NH3 (O) to show that the layer was formed with $NH_3$.

The data in FIG. 11 was collected by Time of Flight Secondary Ion Mass Spectrometry (Tof-SIMS) at various stages of an etching process performed on the respective upper surfaces of the HfSiON or HfSiO layers of FIG. 11. The etching process was a sputtering process. In FIG. 11, the horizontal axis shows an etching time for the etching process, and the vertical axis shows an intensity value indicative of the relative carbon content in the respective HfSiON and HfSiO layers. In FIG. 11, it can be seen that the carbon content in the HfSiON layer is significantly lower than the carbon content in the HfSiO layer.

Figure 12:
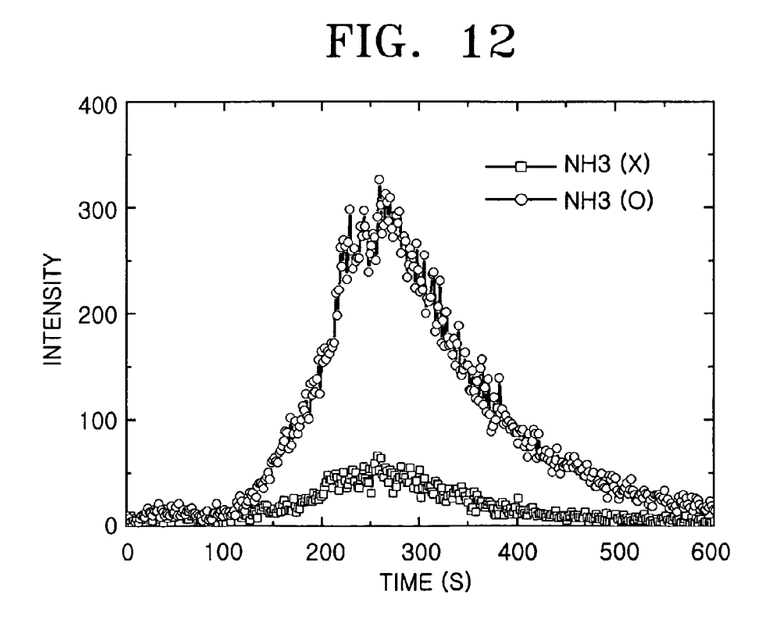

FIG. 12 is a graph illustrating the nitrogen content of a high dielectric film comprising a HfSiON layer formed according to an embodiment of the present embodiment and the nitrogen content of a conventional HfSiO layer. The HfSiO and HfSiON layers of FIG. 12 were formed by the ALD process that was described in relation to FIG. 11. In addition, measurements of the HfSiO layer are indicated in FIG. 12 by the legend NH3 (X) to show that the layer was formed without $NH_3$ and measurements of the HfSiON layer are indicated by the legend NH3 (O) to show that the layer was formed with $NH_3$.

The data in FIG. 12 was collected by Tof-SIMS at various stages of an etching process performed on the respective upper surfaces of the HfSiON or HfSiO layers of FIG. 12. The etching process was a sputtering process. In FIG. 12, the horizontal axis shows an etching time for the etching process, and the vertical axis shows an intensity value indicative of the relative nitrogen content in the respective HfSiON and HfSiO layers. In FIG. 12, it can be seen that the quantity of nitrogen can be precisely controlled without performing an additional annealing process, by using $NH_3$ gas as the additive gas in the ALD process. In addition, the nitrogen content in the HfSiON layer is at least three times higher than that of the HfSiO layer with the same thicknesses.

FIGS. 4 through 10 are gas pulsing diagrams illustrating gases supplied to a reaction chamber when forming a high dielectric film by ALD in accordance with selected embodiments of the present invention. Each of the embodiments illustrated in FIGS. 4 through 10 are briefly described below with reference to the embodiment shown in FIG. 3. In each of the embodiments illustrated in FIGS. 4 through 10, the first source gas, the reactant gas, the second source gas, the additive gas, and the purge gas are supplied to the reaction chamber during different times in a cycle of ALD. The first source gas preferably comprises TEMAH, the first reactant gas preferably comprises $O_3$, the second source gas preferably comprises APTES, the additive gas preferably comprises $NH_3$, and the purge gas preferably comprises argon (Ar).

Referring to FIGS. 4 through 10, the additive gas can be supplied to the reaction chamber at least once between supplying the first source gas and the first reactant gas to the reaction chamber, between supplying the first reactant gas and the second source to the reaction chamber, between supplying the second source gas and the second reactant gas to the reaction chamber, or between supplying the second reactant gas and the first source gas to the reaction chamber in a subsequent cycle.

The additive gas may be supplied to the reaction chamber at least once before and/or after the second source gas is supplied to the reaction chamber. For example, the additive gas may be supplied between supplying the first source gas and supplying the first reactant gas, and between supplying the second source gas and supplying the second reactant gas; a second time. Alternatively, the additive gas may be supplied between supplying the first source gas and supplying the first reactant gas, and then after the second reactant gas; a second time. As another example, additive gas may be supplied between supplying the first reactant gas and the second source gas to the reaction chamber, and then between supplying the second source gas and supplying the second reactant gas to the reaction chamber a second time. As yet another example, the additive gas may be supplied to the reaction chamber between supplying the first reactant gas and supplying the second source gas supply, and after supplying the second reactant gas a second time.

As yet another alternative, the additive gas may be supplied to the reaction chamber at the same time as another gas used in the ALD process. For example, the additive gas could be supplied to the reaction chamber at the same time as at least one of the first source gas, the first reactant gas, the second source gas and the second reactant gas. In addition, the reactant gas could also be supplied together with each of the other gases.

The purge gas is generally supplied to the reaction chamber during several different periods of the ALD process. For example, the purge may be supplied to the reaction chamber after supplying the first source gas, after supplying the first reactant gas, after supplying the second source gas, after supplying the second reactant gas, and after supplying the additive gas. Where the additive gas is supplied to the reaction chamber either after supplying the first source gas, or before or after supplying the first reactant gas, the purge step may be omitted between supplying the first source gas supply and the additive gas, between supplying the additive gas and supplying the first reactant gas, and/or between supplying the first reactant gas and supplying the additive gas.

Figure 4:
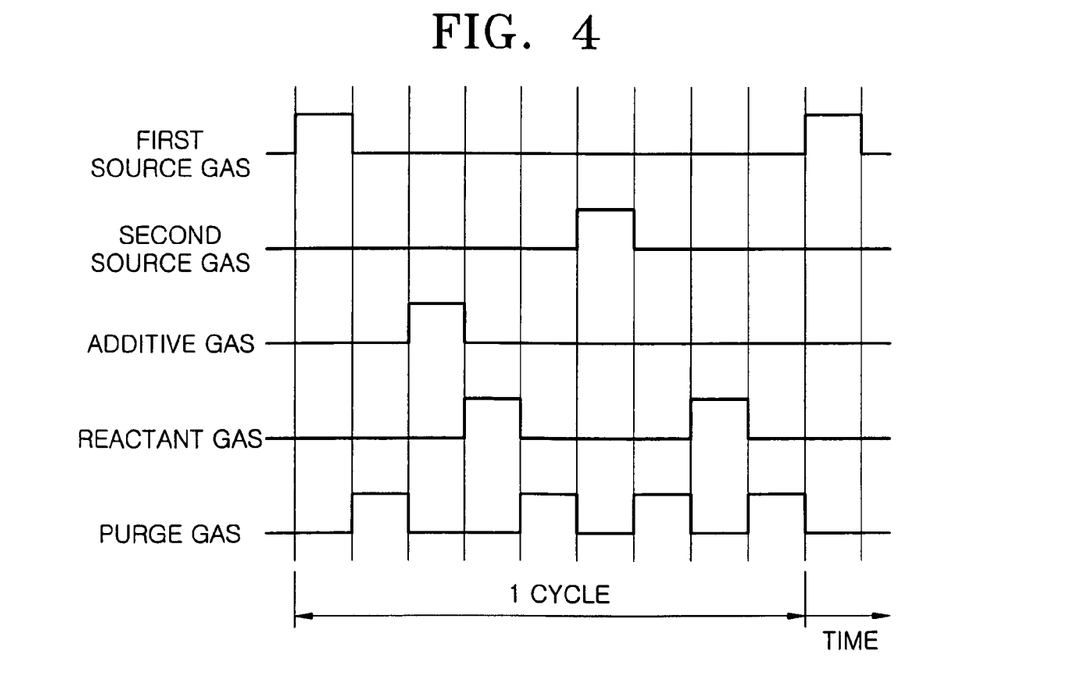

Referring to FIG. 4, the HfSiON layer is formed by supplying the following gases to the reaction chamber in the following order during an ALD process: the first source gas; the purge gas; the additive gas; the first reactant gas; the purge gas; the second source gas; the purge gas; the second reactant gas; and the purge gas. One difference between the methods of FIGS. 3 and 4 is that the purge gas is supplied to the reaction chamber of FIG. 4 before the additive gas and the reactant gas is supplied immediately after supplying the additive gas.

Figure 5:
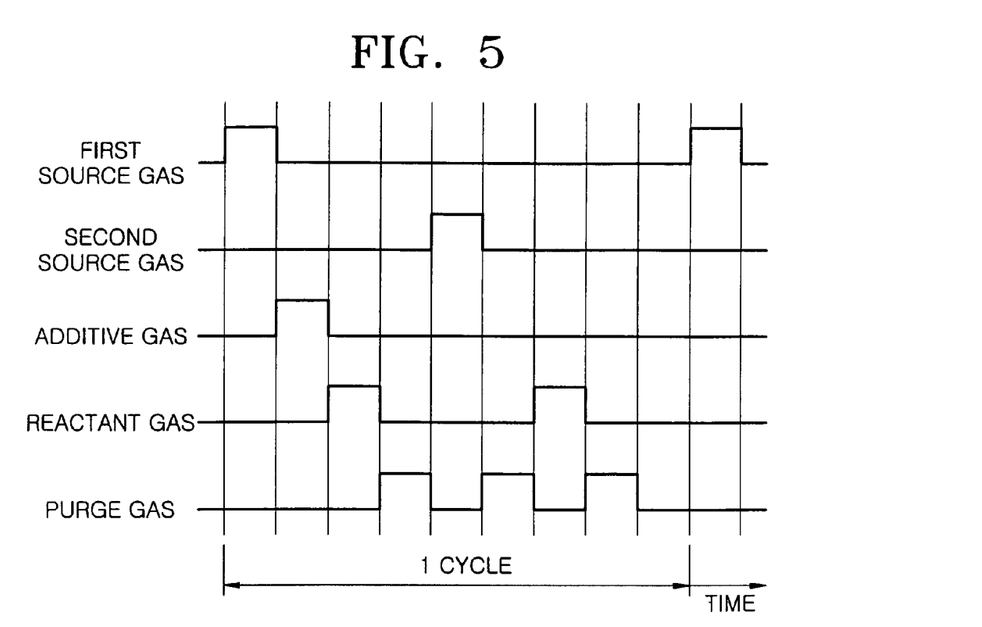

Referring to FIG. 5, the HfSiON layer is formed by supplying the following gases to the reaction chamber in the following order in the ALD process: the first source gas; the additive gas; the first reactant gas; the purge gas; the second source gas; the purge gas; the second reactant gas; and the purge gas. One difference between the methods of FIGS. 3 and 5 is that in FIG. 5, the additive gas and the first reactant gas are supplied to the reaction chamber before the purge gas is supplied to the reaction chamber a first time.

Figure 6:
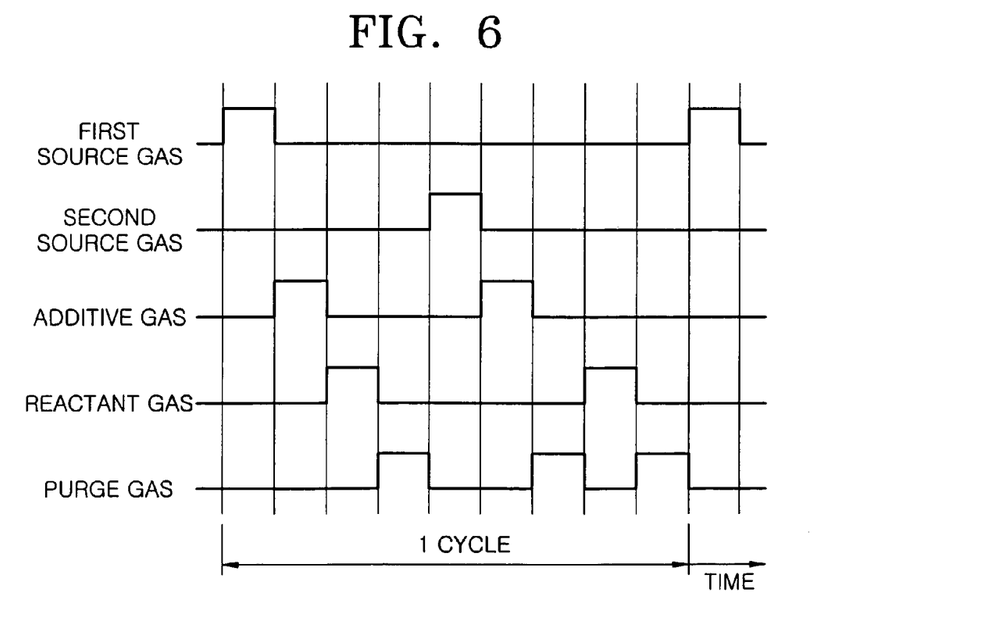

Referring to FIG. 6, the HfSiON layer is formed by supplying the following gases to the reaction chamber in the following order in the ALD process: the first source gas; the additive gas; the first reactant gas; the purge gas; the second source gas; the additive gas; the purge gas; the second reactant gas; and the purge gas. One difference between the methods of FIGS. 5 and 6 is that in FIG. 6, the additive gas is additionally supplied to the reaction chamber after the second source gas without the purge gas being supplied in between.

Figure 7:
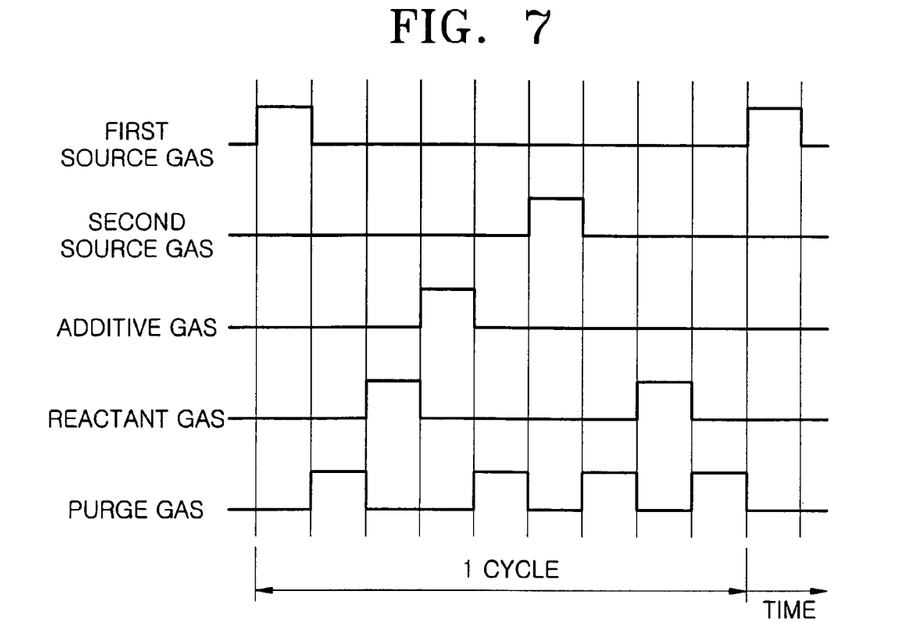

Referring to FIG. 7, the HfSiON layer is formed by supplying the following gases to the reaction chamber in the following order during the ALD process: the first source gas; the purge gas; the first reactant gas; the additive gas; the purge gas; the second source gas; the purge gas; the second reactant gas; and the purge gas. One difference between the methods of FIGS. 3 and 7 is that in FIG. 7, the first reactant gas is supplied to the reaction chamber before the additive gas and the purge gas is supplied to the reaction chamber between the first source gas and the first reactant gas.

Figure 8:
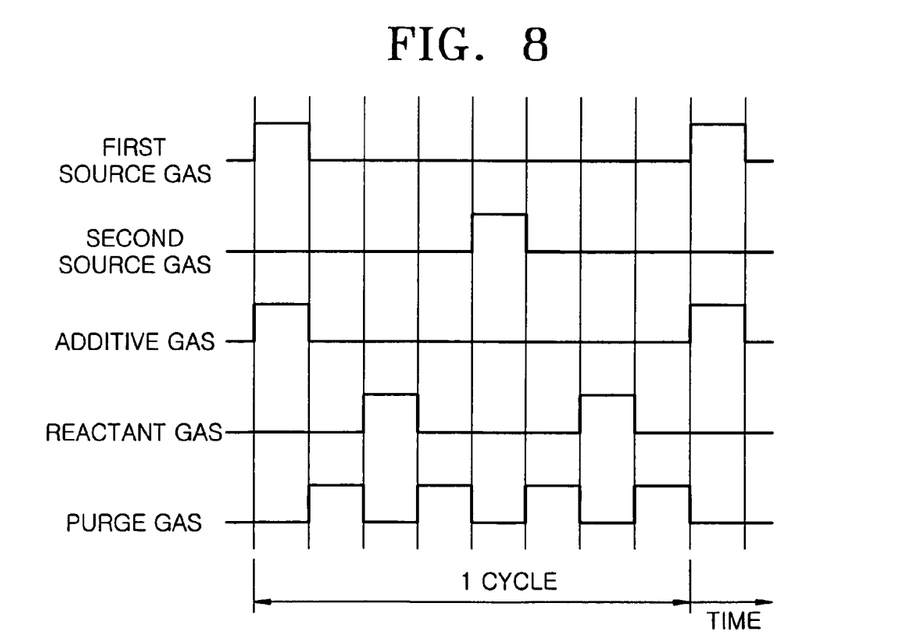

Referring to FIG. 8, the HfSiON layer is formed by supplying the following gases to the reaction chamber in the following order during the ALD process: the first source gas and the additive gas; the purge gas; the first reactant gas; the purge gas; the second source gas; the purge gas; the second reactant gas; and the purge gas. One difference between the methods of FIGS. 3 and 8 is that in FIG. 8, the additive gas is supplied to the reaction chamber at the same time as the first source gas.

Figure 9:
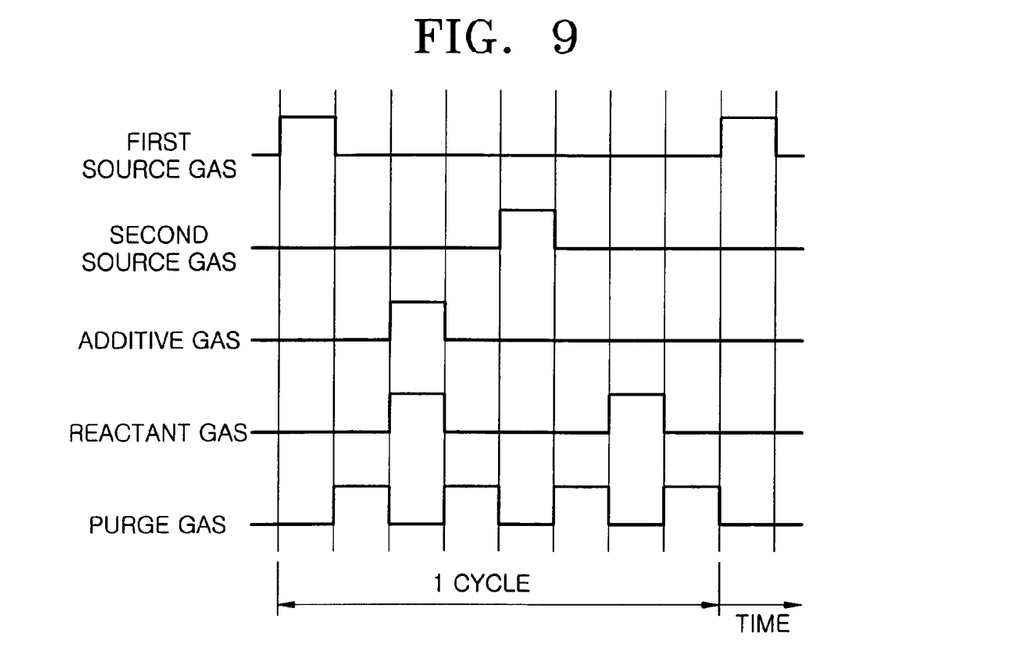

Referring to FIG. 9, the HfSiON layer is formed by supplying the following gases to the reaction chamber in the following order during the ALD process: the first source gas; the purge gas; the additive gas and the first reactant gas; the purge gas; the second source gas; the purge gas; the second reactant gas; and the purge gas. One difference between the methods of FIGS. 8 and 9 is that in FIG. 9 the additive gas is supplied to the reaction chamber at the same time as the first reactant gas.

Figure 10:
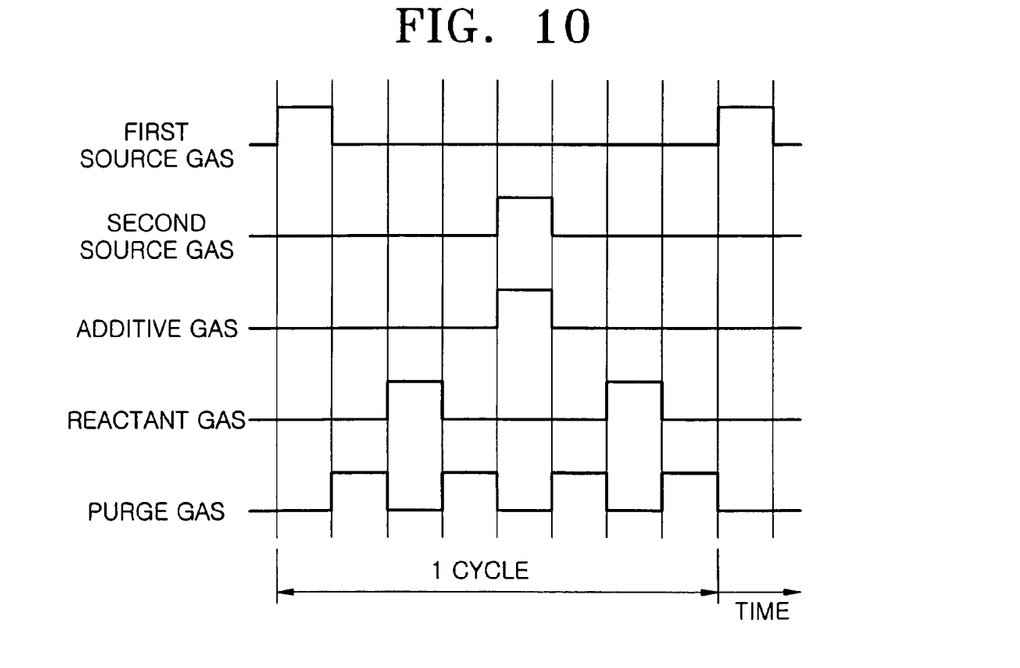

Referring to FIG. 10, the HfSiON layer is formed by supplying the following gases to the reaction chamber in the following order during the ALD process: the first source gas; the purge gas; the first reactant gas; the purge gas; the second source gas and the additive gas; the purge gas; the second reactant gas; and the purge gas. One difference between the methods of FIGS. 8 and 10 is that in FIG. 10 the additive gas is supplied to the reaction chamber at the same time as the second source gas.

The foregoing exemplary embodiments are provided as teaching examples. Those of ordinary skill in the art will understand that various changes in form and details may be made to the exemplary embodiments without departing from the scope of the present invention as defined by the attached claims. For example, a precursor including zirconium (Zr), lanthanum (La), tantalum (Ta), strontium (Sr) or titanium (Ti) could be used as the first source gas instead of the Hf precursor. Also, a precursor including titanium (Ti) or aluminum (Al) could be used as the second source gas instead of the Si precursor. As a result, the high dielectric film formed by the methods described with reference to FIGS. 3 through 10 could comprise a compound formed by adding nitrogen to the following compounds or some composite thereof: ZrSiO, LaSiO, HfTaO, TaTiO, $SrTiO_3$, TiAlO, HfAlO or HfTiO.

The nitrogen content of a high dielectric film formed according to embodiments of the present invention can be controlled by adjusting the time period for which each of the gases in the methods of FIGS. 3 through 10 is supplied to the reaction chamber, and the quantity of additive gas that is supplied to the reaction chamber during each cycle of ALD. In addition, as illustrated by FIG. 12, the nitrogen content of high dielectric films formed according to embodiments of the present invention is generally higher than the nitrogen content of conventionally formed high dielectric layers.

As illustrated by FIG. 11, the methods described with reference to FIGS. 3 through 10 produce high dielectric films with significantly less carbon content than that of conventional high dielectric films. Accordingly, the embodiments of the invention described above provide ways to improve the leakage current characteristics of semiconductor devices.

Although several embodiments of the invention have been described above with reference to a gate structure, these embodiments could also be used to form a dielectric film for a capacitor in a semiconductor device.

What is claimed:

1. A method of forming a high dielectric film by atomic layer deposition (ALD), the method comprising:
    supplying a first source gas to a reaction chamber during a first time interval;
    supplying a first reactant gas to the reaction chamber during a second time interval after the first time interval;
    supplying a second source gas to the reaction chamber for a third time interval after the second time interval;
    supplying a second reactant gas to the reaction chamber for a fourth time interval after the third time interval; and,
    supplying an additive gas including nitrogen to the reaction chamber during a fifth time interval.

2. The method of claim 1, wherein the fifth time interval is between the first and second time intervals.

3. The method of claim 1, wherein the fifth time interval is between the second and third time intervals.

4. The method of claim 1, wherein the fifth time interval is between the third and fourth time intervals.

5. The method of claim 1, wherein the fifth time interval is after the fourth time interval.

6. The method of claim 1, further comprising: supplying the additive gas to the reaction chamber during a sixth time interval after the third time interval; and,
    wherein the fifth time interval is between the first and third time intervals.

7. The method of claim 1, wherein the fifth time interval is substantially the same as one of the first through fourth time intervals.

8. The method of claim 1, further comprising:
    supplying a purge gas to the reaction chamber to purge residual gases following one of the first through fifth time intervals.

9. The method of claim 1, wherein the first source gas comprises a precursor comprising at least one element selected from a group consisting of hafnium (Hf), zirconium (Zr), lanthanum (La), tantalum (Ta), strontium (Sr), and titanium (Ti).

10. The method of claim 1, wherein the first source gas comprises a hafnium (Hf) precursor in which Hf is bonded with oxygen, carbon, hydrogen, chlorine, or nitrogen.

11. The method of claim 1, wherein the first and second reactant gases comprise oxidant gases including oxygen.

12. The method of claim 1, wherein the additive gas comprises a material selected from a group consisting of $NH_3$ gas, $N_2O$ gas, NO gas, and $NH_3$ plasma.

13. The method of claim 1, wherein the second source gas comprises a precursor including silicon (Si), titanium (Ti), or aluminum (Al).

14. The method of claim 1, wherein the high dielectric film comprises a single layer of nitrogen added to a layer comprising HfSiO, ZrSiO, LaSiO, HfTaO, TaTiO, $SrTiO_3$, TiAIO, HfAIO or HfTiO.

15. The method of claim 6,
    wherein the fifth time interval is between the first and second time intervals; and the sixth time interval is between the third and fourth time intervals.

16. The method of claim 6,
    wherein the fifth time interval is between the first and second time intervals; and the sixth time interval is after the fourth time interval.

17. The method of claim 6, wherein the fifth time interval is between the second and third time intervals; and the sixth time interval is between the third and fourth time intervals.

18. The method of claim 6, wherein the fifth time interval is between the second and third time intervals; and the sixth time interval is after the fourth time interval.

19. The method of claim 8, wherein the purge gas is supplied to the reaction chamber before the third time interval.

20. The method of claim 8, wherein the purge gas is supplied to the reaction chamber between each of the first through fifth time intervals and after the fifth time interval.

21. The method of claim 8, wherein the purge gas comprises argon (Ar), helium (He), or nitrogen gas ($N_2$).

22. The method of claim 10, wherein the Hf precursor comprises an element selected from the group consisting of $Hf[N(CH_3)_2]_4$, $Hf[N(C_2H_5)_2]_4$, $Hf[N(C_2H_5)CH_3]_4$, $Hf[OC(CH_3)_3]_4$ and $HfCl_4$.

23. The method of claim 11, wherein each of the first and second reactant gases comprises a material selected from the group consisting of $O_3$, $H_2O$, $H_2O_2$, $CH_3OH$, $C_2H_5OH$, and $C_3H_7OH$.

24. The method of claim 13, wherein the second source gas comprises a silicon (Si) precursor in which Si is bonded with oxygen, carbon, hydrogen, or nitrogen.

25. The method of claim 24, wherein the Si precursor comprises a material selected from a group consisting of $SiH[N(CH_3)_2]_3$, $Si[N(CH_3)_2]_4$, $H_2N(CH_2)_3Si(OC_2H_5)_3$, $Si[N(CH_3)C_2H_5]_4$, and $HSi[N(C_2H_5)_2]_3$.

26. The method of claim 14, further comprising:
    adjusting the duration of the fifth time interval and the quantity of additive gas supplied to the reaction chamber to control the nitrogen content of the high dielectric film.

27. A method of fabricating a semiconductor device, the method comprising:
    forming a high dielectric film on a semiconductor substrate located in a reaction chamber, wherein forming the dielectric film comprises:
    supplying a first source gas to the reaction chamber during a first time interval;
    supplying a first reactant gas to the reaction chamber during a second time interval after the first time interval;
    supplying a second source gas to the reaction chamber for a third time interval after the second time interval;
    supplying a second reactant gas to the reaction chamber for a fourth time interval after the third time interval; and,
    supplying an additive gas including nitrogen to the reaction chamber during a fifth time interval; and,
    forming a gate electrode material on the high dielectric film; and,
    etching the gate electrode material and the high dielectric film to form a gate structure.

28. The method of claim 27, wherein the gate electrode material comprises a conductive layer doped with impurity ions.

29. The method of claim 28, wherein the gate electrode material comprises a polysilicon layer.

30. A method of fabricating a semiconductor device, the method comprising: forming a lower electrode on a semiconductor substrate;

forming a high dielectric film on the lower electrode, wherein forming the high dielectric film comprises:

supplying a first source gas to a reaction chamber during a first time interval;

supplying a first reactant gas to the reaction chamber during a second time interval after the first time interval;

supplying a second source gas to the reaction chamber for a third time interval after the second time interval;

supplying a second reactant gas to the reaction chamber for a fourth time interval after the third time interval; and, supplying an additive gas including nitrogen to the reaction chamber during a fifth time interval; and, forming an upper electrode on the high dielectric film.

31. The method of claim 30, wherein the upper electrode and the lower electrode comprise conductive layers doped with impurity ions.

* * * * *